US006763840B2

(12) United States Patent
DeSimone et al.

(10) Patent No.: US 6,763,840 B2
(45) Date of Patent: Jul. 20, 2004

(54) METHOD AND APPARATUS FOR CLEANING SUBSTRATES USING LIQUID CARBON DIOXIDE

(75) Inventors: Joseph M. DeSimone, Chapel Hill, NC (US); James P. DeYoung, Durham, NC (US); James B. McClain, Raleigh, NC (US)

(73) Assignee: Micell Technologies, Inc., Raleigh, NC (US)

( * ) Notice: Subject to any disclaimer, the term of this patent is extended or adjusted under 35 U.S.C. 154(b) by 201 days.

(21) Appl. No.: 09/953,061

(22) Filed: Sep. 14, 2001

(65) Prior Publication Data

US 2003/0051741 A1 Mar. 20, 2003

(51) Int. Cl.[7] ................................................. B08B 3/00
(52) U.S. Cl. ....................... 134/109; 134/105; 134/108; 134/184; 134/186; 134/902
(58) Field of Search ................................ 134/105, 108, 134/109, 110, 111, 184, 186, 902; 156/345.18, 345.31, 345.32

(56) References Cited

U.S. PATENT DOCUMENTS

| 5,482,564 A | 1/1996 | Douglas et al. ............... 134/18 |
| 5,494,526 A | 2/1996 | Paranjpe ........................ 134/1 |
| 5,514,220 A | 5/1996 | Wetmore et al. ......... 134/22.18 |
| 5,522,938 A | 6/1996 | O'Brien .......................... 134/1 |

(List continued on next page.)

FOREIGN PATENT DOCUMENTS

| EP | 0587168 | 3/1994 | ............. B08B/7/00 |
| EP | 0681317 | 11/1995 | ......... H01L/21/306 |
| EP | 0836895 | 4/1998 | ............. B08B/7/00 |
| EP | 0893166 | 1/1999 | ............. B08B/3/02 |
| TW | 318151 | 10/1997 | |
| TW | 451337 | 8/2000 | ......... H01L/21/304 |
| WO | WO 00/77135 | 12/2000 | |
| WO | WO01/33613 | 5/2001 | ........... H01L/21/00 |
| WO | WO01/33615 | 5/2001 | ........... H01L/21/00 |
| WO | WO01/46999 | 6/2001 | ........... H01L/21/00 |
| WO | WO 01/49920 | 7/2001 | ........... D06F/43/00 |

OTHER PUBLICATIONS

"Plasma in Materials Fabrication" by Grill, IEEE Press, 1993, pp. 110, 111.*

(List continued on next page.)

*Primary Examiner*—M. Kornakov
(74) *Attorney, Agent, or Firm*—Myers Bigel Sibley & Sajovec, P.A.

(57) ABSTRACT

Methods for cleaning a microelectronic substrate in a cluster tool are described that include placing the substrate in a pressure chamber of a module in a cluster tool; pressurizing the pressure chamber; introducing liquid $CO_2$ into the pressure chamber; cleaning the substrate in the pressure chamber; removing the liquid $CO_2$ from the pressure chamber, depressurizing the pressure chamber, and removing the substrate from the pressure chamber. Apparatus for processing a microelectronic substrate are also disclosed that that include a transfer module, a first processing module that employs liquid carbon dioxide as a cleaning fluid coupled to the transfer module, a second processing module coupled to the transfer module, and a transfer mechanism coupled to the transfer module. The transfer mechanism is configured to move the substrate between the first processing module and the second processing module.

32 Claims, 4 Drawing Sheets

U.S. PATENT DOCUMENTS

| | | | |
|---|---|---|---|
| 5,700,379 A | 12/1997 | Biebl | 216/2 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,922,833 A | 7/1999 | DeSimone et al. | 528/490 |
| 5,944,996 A | 8/1999 | DeSimone et al. | 210/634 |
| 5,976,264 A | 11/1999 | McCullough et al. | 134/2 |
| 6,001,418 A | 12/1999 | DeSimone et al. | 427/240 |
| 6,024,801 A * | 2/2000 | Wallace et al. | 134/1 |
| 6,030,663 A | 2/2000 | McClain et al. | 427/389.9 |
| 6,067,728 A | 5/2000 | Farmer et al. | 34/470 |
| 6,082,150 A | 7/2000 | Stucker | 68/18 R |
| 6,149,828 A | 11/2000 | Vaartstra | 216/57 |
| 6,240,936 B1 | 6/2001 | DeSimone et al. | 134/33 |
| 6,242,165 B1 | 6/2001 | Vaartstra | 430/329 |
| 6,277,753 B1 | 8/2001 | Mullee et al. | 438/692 |
| 2002/0112740 A1 | 8/2002 | DeYoung et al. | 134/3 |

OTHER PUBLICATIONS

Bok, E. et al. Supercritical Fluids for Single Wafer Cleaning, *Solid State Technology*, pp. 117–120 (1992).

Rubin, J.B. et al. A Comparison of Chilled DI Water/Ozone and $CO_2$–Based Supercritical Fluids as Replacements for Photoresist–Stripping Solvents, *IEEE/CPMT Int'l Electronics Manufacturing Technology Symposium*, 308–314 (1998).

Sarbu, T. et al. Non–fluorous Polymers with Very High Solubility in Supercritical $CO_2$ Down to Low Pressures, *Nature*, 405:165–168 (2000).

Jafri, I. et al. Critical Point Drying and Cleaning for MEMS Technology, *SPIE*, vol. 3880, pp. 51–58 (1999).

Dyck, C. W. et al. Supercritical Carbon Dioxide Solvent Extraction from Surface–Micromachined Micromechanical Dtructures, *SPIE Micromachining and Microfabrication*, Oct. (1996).

Wang, C.W. et al. Supercritical $CO_2$ Fluid for Chip Resistor Cleaning, *Journal of the Electrochemical Society*, vol. 146, pp. 3485–3488 (1999).

Chitanvis, S.M. et al. Dynamics of Particle Removal by Supercritical Carbon Dioxide, Chapter 4, pp. 70–86, from *Supercritical fluid cleaning : fundamentals, technology, and applications* (edited by McHardy and Sawan) (1998).

* cited by examiner-

METHOD AND APPARATUS FOR CLEANING SUBSTRATES USING LIQUID CARBON DIOXIDE

FIELD OF THE INVENTION

The present invention relates to methods and apparatus for cleaning substrates, and, more particularly, to methods and apparatus for cleaning substrates using $CO_2$.

BACKGROUND OF THE INVENTION

Integrated circuits (ICs), optoelectronic devices, micromechanical devices and other precision fabrications are commonly formed using thin films applied to substrates. As part of the fabrication process, it is often necessary to remove or clean a portion or all of the thin film from the substrate. For example, in the manufacture of semiconductor wafers including ICs, a thin photoresist layer may be applied to the semiconductor substrate and subsequently removed.

Contaminants removed from surface features of microelectronic substrates after various manufacturing steps (e.g., after post-ion implant, 'back end of the line' (BEOL) cleans, 'front end of the line' (FEOL) cleans, and post chemical mechanical planarization (CMP) steps) may vary dramatically in nature and composition. Accordingly, cleaning and treating steps must address these contaminants with the appropriate chemistries and solvents to either react with, ionize, dissolve, swell, disperse, emulsify, or vaporize them from the substrate. As such, a variety of wet (e.g., water and solvent) cleaning processes, and dry (e.g., plasma) cleaning processes have been developed to address the broad variety of waste materials.

SUMMARY OF THE INVENTION

The present invention relates generally to, inter alia, the cleaning or treating of microelectronic substrates (such as semiconductor substrates) during or subsequent to the manufacturing of microelectronic substrates such as integrated circuits, microelectronic devices, MEM's, MEOM's and opto-electronic devices. Removal of surface contaminants and particulates is a key step in the integrated circuit fabrication process. There are numerous cleaning steps in the fabrication process including, but not limited to, pre-diffusion cleans, post-ash cleans, post-etch cleans, pre-metal deposition cleans, plasma strip, clean/strip, post-ion implantation cleans and post-chemical mechanical planarization (CMP) cleans. There are many types and sources of particulates and contaminants in the fabrication process. The particles and contaminants may be molecular, ionic, atomic or gaseous in nature. The source may be inherent (e.g., redeposition of resist) or extrinsic to the process (e.g., wafer transport).

In embodiments of the present invention, methods for cleaning a microelectronic substrate in a cluster tool that include placing the substrate in a pressure chamber of a module in a cluster tool, pressurizing the pressure chamber, introducing liquid $CO_2$ into the pressure chamber, cleaning the substrate in the pressure chamber, removing the liquid $CO_2$ from the pressure chamber, depressurizing the pressure chamber, and removing the substrate from the pressure chamber are provided.

In other embodiments of the present invention, apparatus for processing a microelectronic substrate are provided that include a transfer module, a first processing module that employs liquid carbon dioxide as a cleaning fluid coupled to the transfer module, and a transfer mechanism coupled to the transfer module. The transfer mechanism is configured to move the substrate between the first processing module and the second processing module.

The shift from $Al/SiO_2$ interconnect systems to Cu/low-k interconnect systems presents new challenges that may be effectively addressed using the methods and apparatus of the present invention. For example, a primary problem with the transition to Cu is the tendency of Cu to corrode when exposed to an oxidizing environment because Cu does not have the self-passivating properties of Al. Corrosion of Cu during cleans of dual damascene structures can result in high contact resistance, undercutting and lift-off of the dielectric layers, thereby reducing circuit yields. Additional concerns have focused on the chemical compatibility of traditional cleans with low-k materials. As an example, it has been demonstrated that amine chemistries gas from OSG and other inorganic spin-on dielectric films, causing via poisoning. Aspects of the present invention may address the currently challenging cleans of these new interconnect systems.

DETAILED DESCRIPTION OF THE PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be appreciated by those of skill in the art from the description herein that various components and steps as described herein below may be omitted or replaced with other (for example, conventional) components or steps as appropriate.

As used herein, the term "microelectronic substrate" should be interpreted broadly to include semiconductor substrates, semiconductor substrates on which one or more layer resides, integrated circuits, microelectronic workpieces, microelectronic devices, MEM's, MEOM's and opto-electronic devices.

As used herein, the term "processing time" means the time elapsed during a given process. For a process module, the process time is measured from the time a microelectronic substrate completely crosses the threshold of the process module (e.g., the module's pressure chamber) when placed into the module until the time the microelectronic substrate completely crosses the threshold of the process module when removed from the module.

Figure 1:
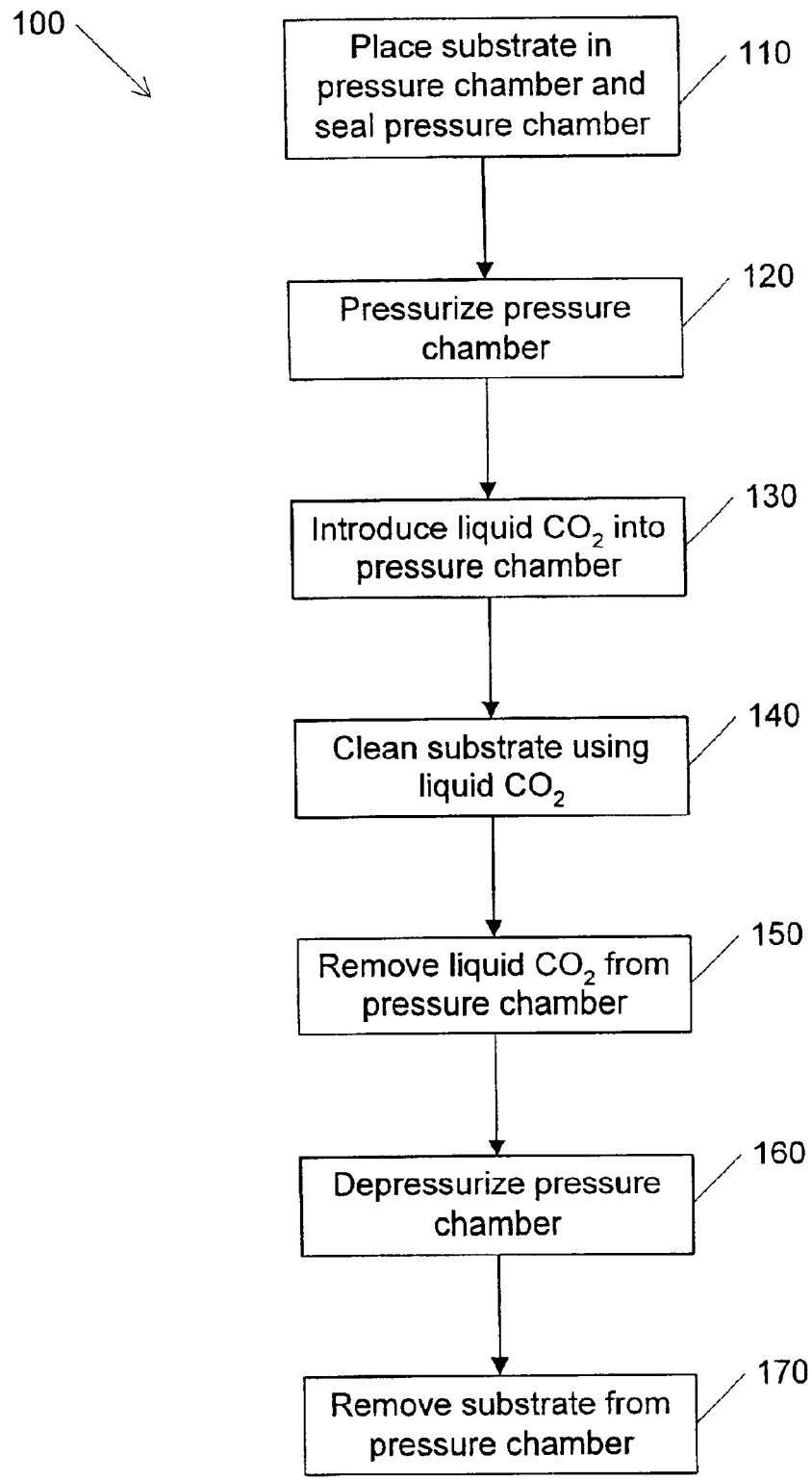
FIG. 1 illustrates a method of cleaning a substrate in a pressure chamber.

Referring now to FIG. 1, a process for cleaning a microelectronic substrate in a cluster tool according to embodiments of the present invention will now be described. The microelectronic substrate is placed in a pressure chamber of a cleaning module of a cluster tool and the pressure chamber is sealed (110). Preferably, the pressure chamber is sealed utilizing a sealing controller located on the cluster tool as will be understood by those skilled in the art.

The pressure chamber is then pressurized (120). The pressure chamber is preferably pressurized utilizing carbon dioxide gas; however, it is to be understood that gases including, but not limited to, carbon dioxide, air, nitrogen, argon, helium, and mixtures thereof may be used to pressurize the pressure chamber. The pressure chamber is preferably pressurized to a pressure such that the temperature and pressure of the pressure chamber are within the liquid portion of a carbon dioxide phase diagram as will be understood by those skilled in the art. More preferably, the pressure chamber is pressurized to a pressure such that at a temperature of about 0 to 30° C., liquid $CO_2$ in the pressure chamber would be at saturation conditions or slightly (e.g., 1, 2, 3, 4 or 5° C.) subcooled.

Liquid $CO_2$ is then introduced into the pressure chamber (130). In some embodiments of methods of the present invention, the pressure chamber is partially filled with liquid $CO_2$ such that a liquid volume and a vapor volume are formed. In other embodiments, the introduction of the liquid $CO_2$ into the pressure chamber includes forming a pool of liquid $CO_2$ in the pressure chamber, and forming a gas phase in the pressure chamber that contacts the liquid $CO_2$ pool and separates the liquid $CO_2$ pool from a portion of the pressure chamber wall. The atmosphere may include $CO_2$ gas, a non-$CO_2$ gas, or a mixture thereof. Non-$CO_2$ gases include, but are not limited to, nitrogen, helium, argon, air, and mixtures thereof. The non-$CO_2$ gas is preferably an inert gas.

The temperature of the liquid $CO_2$ in the pressure chamber is maintained between about −57° C. and 31° C. Preferably, the temperature of the liquid $CO_2$ in the pressure chamber is maintained between about −5, 0 or 5° C. and 20, 25 or 30° C. More preferably, the temperature of the liquid $CO_2$ in the pressure chamber is maintained between about 5, 10 or 15° C. and 20, 25 or 30° C.

During the introduction of liquid $CO_2$ into the chamber and/or during the subsequent cleaning process, the temperature in the pressure chamber is maintained at or below the critical temperature of $CO_2$ to ensure that the fluid remains in a liquid state. The pressure may be allowed to exceed the critical pressure of $CO_2$, provided the temperature is below the critical pressure. When the liquid $CO_2$ partially fills the pressure chamber such that a liquid $CO_2$ pool and a gas phase above the liquid $CO_2$ pool are formed in the pressure chamber, the temperature and optionally the pressure in the pressure chamber may be maintained below critical points by various means as will be understood by those skilled in the art. The temperature of the liquid $CO_2$ is preferably maintained below the critical temperature by cooling the liquid $CO_2$. While the liquid $CO_2$ may be cooled in situ (i.e., within the pressure chamber), the liquid $CO_2$ is preferably cooled by removing a portion of the liquid $CO_2$ from the pressure chamber, cooling the portion to a desired temperature below the critical temperature of liquid $CO_2$ or of the liquid $CO_2$ mixture if a secondary gas or cleaning adjuncts are used, and returning the portion of the liquid $CO_2$ to the pressure chamber.

In another embodiment in which a liquid and gas phase co-exist in the chamber, the partial pressure of $CO_2$ gas in the gas-phase of the pressure chamber is maintained below the saturation pressure of pure $CO_2$ at the temperature of the liquid $CO_2$ pool. The differential between the partial pressure of $CO_2$ gas in the gas-phase and the saturation pressure of pure $CO_2$ at the temperature of the liquid $CO_2$ pool is preferably between about 0.1 atmospheres and 10 atmospheres. The partial pressure of the $CO_2$ gas in the gas phase of the pressure chamber may be maintained below the saturation pressure corresponding to pure $CO_2$ at a given temperature by various means. For example, a secondary gas with a higher saturated vapor pressure than $CO_2$ can be used. Furthermore, when a secondary gas is used, the temperature of the liquid phase can be lowered and raised to adjust the partial pressure of the $CO_2$ in the gas phase. The various methods of maintaining the temperature and partial-pressure of $CO_2$ in the pressure chamber below saturation conditions for pure $CO_2$ may be used alone or may be used in combination.

In some embodiments of methods of the present invention, an adjunct is introduced into the pressure chamber. The adjunct is preferably introduced in an amount sufficient to facilitate cleaning or other processing of the substrate. As will be understood by those skilled in the art, the adjunct may be selected from various adjuncts including, but not limited to, water, oxidizers such as peroxides or permanganates, acids such as hydrofluoric, sulfuric, and nitric acid, bases such as secondary and tertiary amines, ammonium hydroxide, solvents such as organic carbonates, lactones, ketones, ethers, alcohols, sulfoxides, thiols, and alkanes, surfactants such as block copolymers or random copolymers composed of fluorinated segments and hydrophilic or lipophilic segments, surfactants with siloxane-based components and hydrophilic or lipophilic components, conventional ionic, and non-ionic hydrocarbon-based surfactants, salts such as ammonium fluoride and choline, and mixtures thereof. The process of introducing the adjunct into the pressure chamber may be performed before, concurrently with, and/or after the introduction of the liquid $CO_2$ into the pressure chamber. It may be preferable to introduce the liquid $CO_2$ and the adjunct into the pressure chamber as a mixture.

After the liquid $CO_2$ and the adjunct have been introduced into the pressure chamber, the adjunct may become admixed with the liquid $CO_2$. The density of the liquid $CO_2$ in the pressure chamber is preferably decreased to deposit the adjunct from the mixture onto the substrate. The density of the liquid $CO_2$ may be decreased in various ways. For example, the temperature of the liquid $CO_2$ in the pressure chamber may be increased and/or the pressure of fluid in the pressure chamber may be decreased. While embodiments of the present invention are described herein as utilizing liquid $CO_2$, it is to be understood that liquid compositions comprising liquid $CO_2$ could be used in the methods and/or apparatus of the present invention.

The substrate is cleaned using the liquid $CO_2$ (140). The substrate may be cleaned in various ways using the liquid $CO_2$ including, but not limited to, spraying the substrate with the liquid $CO_2$, immersing the substrate in the liquid $CO_2$, and flowing the liquid $CO_2$ across the surface of the substrate. It is to be understood that the process of cleaning the substrate using the liquid $CO_2$ may occur, either in part or in whole, during the process of introducing the liquid $CO_2$ into the pressure chamber. In preferred embodiments, a waste layer is on the microelectronic substrate, and the process of cleaning the substrate includes removing the waste layer from the substrate. The waste layer may be various waste layers that accumulate on microelectronic substrates during the fabrication of such substrates and may include, but not be limited to, chemical mechanical polishing residues, post-ion implantation residues, reactive ion etch residues, post-ash residues, photoresists, or mixtures thereof. The waste layer preferably includes a particulate phase.

The liquid $CO_2$ is removed from the pressure chamber (150). The liquid $CO_2$ may be removed from the pressure chamber after the substrate is substantially cleaned or the liquid $CO_2$ may be removed from the pressure chamber before the substrate is substantially cleaned. If the liquid $CO_2$ is removed from the pressure chamber before the substrate is substantially cleaned, additional liquid $CO_2$ is preferably introduced into the pressure chamber as described above with reference to block 130. In this way, a plurality (e.g., 2, 3, 4, 5, 6 or more) of liquid $CO_2$ introduction and removal processes may be performed. Preferably, the liquid $CO_2$ introduction and removal processes are repeated as necessary to obtain the desired cleanliness of the microelectronic substrate.

The liquid $CO_2$ may be removed from the pressure chamber by various processes. For example, the liquid $CO_2$ may be gravity drained from the pressure chamber. When this process is employed, the liquid $CO_2$ is preferably gravity drained from the pressure chamber into a liquid carbon dioxide storage tank. Vapor communication is preferably provided between a vapor space in the pressure chamber and a vapor space in the liquid carbon dioxide storage tank.

Preferably, the liquid $CO_2$ is removed from the pressure chamber by introducing a pressurized gas into the pressure chamber, and forced plug flowing the liquid $CO_2$ out of the pressure chamber. The pressurized gas may comprise $CO_2$ gas, supercritical $CO_2$, or a non-$CO_2$ gas. The non-$CO_2$ gas may be an inert gas, such as helium, a non-inert gas, such as nitrogen, argon, or air. The pressurized gas may also be a mixture of a $CO_2$ gas and a non-$CO_2$ gas or a mixture of non-$CO_2$ gas. When the pressurized gas is $CO_2$ gas, the $CO_2$ gas is preferably at a pressure that is greater than the pressure of the fluid in the pressure chamber and is preferably at a temperature that is greater than the temperature of the fluid in the pressure chamber.

In some embodiments of methods according to the present invention, the temperature of the fluid in the pressure chamber is cooled to a temperature below saturation temperature for the given pressure, termed "subcooling", while removing the liquid from the pressure chamber. In cases where liquid and gas coexist, rapid cooling of the liquid phase brings the system out of equilibrium causing the gas phase to become supersaturated for a period of time until the system reaches equilibrium. Subcooling the liquid during draining can be advantageous in the prevention of boiling during the draining step and can speed the removal of the liquid. In other embodiments, greater than about 99 percent of the mass of the liquid $CO_2$ is removed from the pressure chamber as liquid $CO_2$, and, preferably, greater than about 99.5 percent of the mass of the liquid $CO_2$ in the pressure chamber is removed from the pressure chamber as liquid $CO_2$.

When removing the liquid $CO_2$ from the pressure chamber, the flow rate of liquid $CO_2$ out of the pressure chamber is preferably greater than about 0.1 chamber volumes per second, is more preferably greater than about 1.0 chamber volume per second and is still more preferably greater than about 3.0 chamber volumes per second.

After removing the liquid $CO_2$ from the pressure chamber, the pressure chamber is depressurized (160). In some embodiments according to the present invention, $CO_2$ gas remains in the pressure chamber after the removing of the liquid $CO_2$ from the pressure chamber. The depressurizing of the pressure chamber includes removing the $CO_2$ gas from the pressure chamber. The removed $CO_2$ gas is preferably conserved. For example, the removed $CO_2$ gas may be stored in a gas storage tank. The stored $CO_2$ gas may then be charged into the pressure chamber in a subsequent cleaning cycle. As another example, the removed $CO_2$ gas is transferred to another pressure chamber. The other pressure chamber is preferably in a module on a cluster tool. Preferably, the cluster tool is the same cluster tool as the one containing the cleaning module. As still another example, the $CO_2$ gas is removed from the pressure chamber, stored in a gas storage tank, and transferred from the gas storage tank to another pressure chamber. Of course, some or all of the $CO_2$ gas may be vented to atmosphere.

In some embodiments according to the present invention, the pressure chamber is depressurized such that, at the time the $CO_2$ gas is removed from the pressure chamber, the maximum density of a $CO_2$-containing composition in the pressure chamber is less than the critical density of the $CO_2$-containng composition. Preferably, the maximum density of the $CO_2$-containing composition in the pressure chamber is less than about 0.4 grams/cm$^3$. More preferably, the maximum density of the $CO_2$-containing composition in the pressure chamber is between about 0.2 and 0.3 grams/cm$^3$.

After depressurizing the pressure chamber, the substrate is removed from the pressure chamber (170). In some embodiments, the substrate is placed in another pressure chamber following removing the substrate from the pressure chamber. The process of removing the substrate from the pressure chamber and placing the substrate in another pressure chamber is preferably automated. After placing the substrate in the other pressure chamber, a subsequent process may be performed on the substrate in the other pressure chamber. The subsequent process may employ $CO_2$ as a processing fluid or may be a non-$CO_2$ based process. After placing the substrate in the other pressure chamber, the other pressure chamber may be pressurized using $CO_2$ gas from the pressure chamber as described above.

Methods according to embodiments of the present invention may have improved processing times when compared with processing times of for conventional processes that employ, for example, supercritical carbon dioxide as a processing fluid. Processes according to embodiments of the present invention have processing times that are preferably less than 2 minutes, more preferably less than 135, 90, or 75 seconds, and still more preferably less than 70, 60, 50 or 45 seconds.

Figure 2:
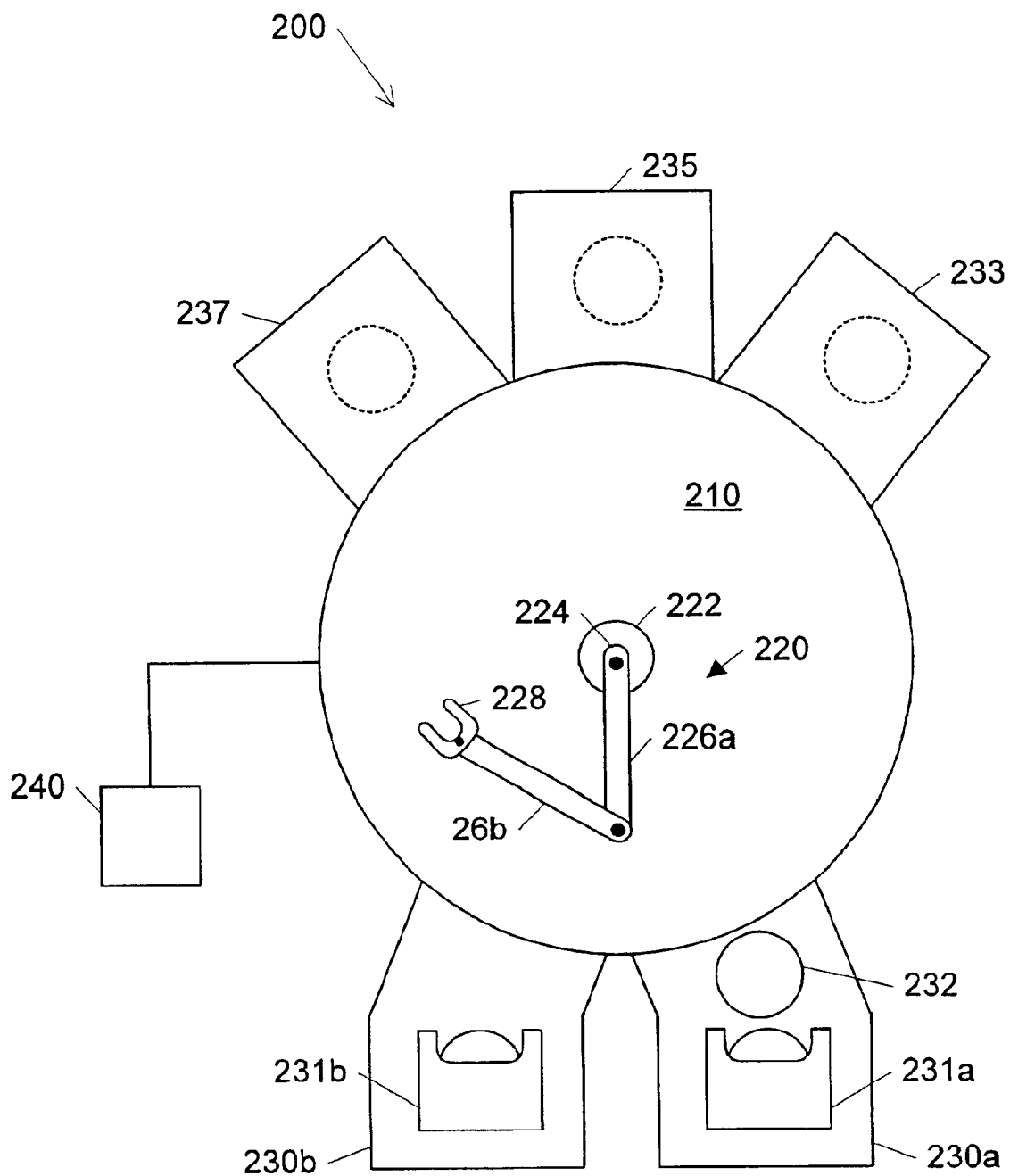
FIG. 2 illustrates a cluster tool according to embodiments of the present invention for performing fabrication, specifically chemical mechanical planarization, of a semiconductor substrate.

Referring now to FIG. 2, an apparatus 200 according to embodiments of the present invention will now be described. As illustrated, the apparatus 200 is a cluster tool apparatus configured to perform chemical mechanical planarization processes on microelectronic device substrates. The apparatus 200 includes a transfer module 210. The transfer module is coupled to a first loadlock module 230*a* and a second loadlock module 230*b*. Although the embodiments illustrated in FIG. 2 show the transfer module coupled to first loadlock module 230*a* and second loadlock module 230*b*, it is to be understood that transfer modules according to embodiments of the present invention may be coupled to one or more loadlock modules. While the embodiments illustrated in FIG. 2 show the loadlock modules 230*a* and 230*b* coupled directly to the transfer module 210, it is to be understood that transfer modules of the present invention may be coupled indirectly (e.g., with an intervening transfer module) to the loadlock modules.

First and second loadlock modules 230a and 230b, respectively, each have a wafer cassette, 231a and 231b, respectively, that include one or more wafers 232. The wafer 232 is a wafer of semiconductor material such as silicon, silicon oxide, gallium arsenide, etc. Other types of workpieces may be cleaned or otherwise treated using the apparatus including, for example, various other semiconductor substrates as will be understood by those skilled in the art. The wafer 232 is in need of chemical mechanical planarization processing.

The transfer module 210 includes a robot 220. The robot 220 includes a base 222 coupled to the transfer module 210. The base 222 is coupled to a first extendable arm 226a. The first extendable arm 226a is coupled to a second extendable arm 226b, which is coupled to a substrate engagement member 228. While the substrate engagement member 228 is preferably configured to transfer a single wafer, it is to be understood that substrate engagement members according to the present invention may be configured to transfer a cassette including one or more wafers. Although the transfer module 210 as illustrated in FIG. 2 includes a robot 220, it is to be understood that transfer modules of the present invention may include various other transfer mechanisms as will be understood by those skilled in the art.

As illustrated in FIG. 2, the transfer module 210 has a circular configuration. It is to be understood that transfer modules according to the present invention may have various other configurations including, but not limited to, track configurations as will be understood by those skilled in the art.

The transfer module 210 is coupled to a chemical mechanical planarization (CMP) module 233. The CMP module 210 may be various modules as will be understood by those skilled in the art. Preferably, the CMP module 210 employs a $CO_2$-based slurry and/or a $CO_2$-philic slurry as described in co-pending and co-owned application, Ser. No. 09/816,956 filed Mar. 23, 2001, which is incorporated herein by reference in its entirety.

The transfer module 210 is coupled to a rinse module 235 as will be understood by those skilled in the art. The rinse module 235 may employ various rinse fluids as will be understood by those skilled in the art. In a preferred embodiment, the rinse module 235 employs a $CO_2$-based fluid as a rinse fluid.

The transfer module 210 is further coupled to a liquid $CO_2$ cleaning module 237. The liquid $CO_2$ cleaning module 237 is capable of removing a waste layer comprising CMP residue and will be described further hereinbelow. While the embodiments illustrated in FIG. 2 show a separate liquid $CO_2$ cleaning module 237 and rinse module 235, it is to be understood that the rinse function and the liquid $CO_2$ cleaning function may be performed by the same module, particularly, but not exclusively, when the rinse fluid comprises liquid $CO_2$.

A control system 240 is coupled to the transfer module 210. The control system 210 is configured to control the transfer of the wafers from module to module, to control the conditions (e.g., pressure and temperature) of the various modules, etc. While the embodiments illustrated in FIG. 2 show an apparatus 200 having a single control system 210, it is to be understood that apparatus according to the present invention may have one or more control systems. For example, each module in the cluster tool could have its own control system.

While various processing fluids may be utilized in the various processing modules of the apparatus 200, it may be preferable to employ liquid $CO_2$ as the processing fluid in the CMP module 233, the rinse module 235 and the liquid $CO_2$ cleaning module 237. By employing liquid $CO_2$ in each of the processing modules, it may be possible to maintain the entire apparatus at a single operating pressure, rather than have to pressurize and depressurize each module to the modules required operating pressure. Maintaining the entire apparatus at a single operating pressure may improve the processing time for the apparatus by eliminating many of the pressurization/depressurization steps. Maintaining the entire apparatus at a single operating pressure for using liquid $CO_2$ may also provide a cleaner process because the apparatus will be operated at a positive pressure, rather than a vacuum.

Figure 3:
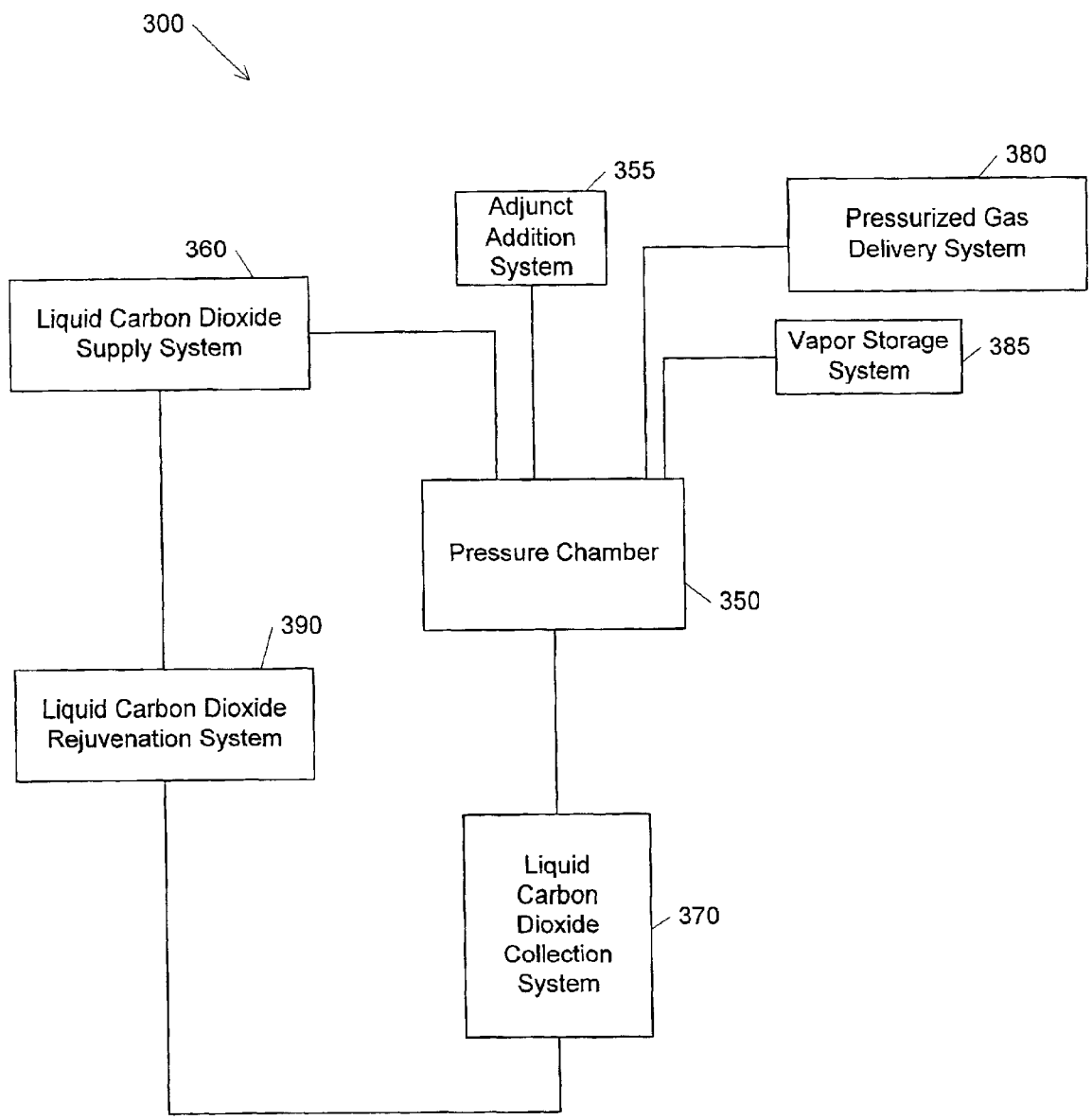
FIG. 3 illustrates a schematic representation of a cleaning apparatus according to embodiments of the present invention.

Turning now to FIG. 3, a liquid $CO_2$ cleaning system 300 according to embodiments of the present invention for use with an apparatus such as the one described above with reference to FIG. 2 will now be described. The liquid $CO_2$ cleaning system 300 includes a pressure chamber 350 that preferably resides in a liquid $CO_2$ cleaning module, such as the liquid $CO_2$ cleaning module 237 described above with reference to FIG. 2. The pressure chamber 350 is configured to clean a microelectronic substrate as will be understood by those skilled in the art.

The pressure chamber 350 is in fluid communication with a liquid carbon dioxide supply system 360. The liquid carbon dioxide supply system 360 is configured to deliver liquid carbon dioxide or a liquid carbon dioxide based cleaning composition to the pressure chamber. The pressure chamber 350 is also in fluid communication with a liquid carbon dioxide collection system 370. The liquid carbon dioxide collection system 370 is configured to receive liquid carbon dioxide that is removed from the pressure chamber 350. The liquid carbon dioxide collection system 370 is in fluid communication with a liquid carbon dioxide rejuvenation system 390, which rejuvenation system is in fluid communication with the liquid carbon dioxide supply system 360. The liquid carbon dioxide rejuvenation system 390 is configured to remove contaminants from the liquid carbon dioxide in the liquid carbon dioxide collection system 370 such that the "rejuvenated" liquid carbon dioxide, which is preferably pure liquid carbon dioxide, can be introduced into the liquid carbon dioxide supply system 360. In this way, the rejuvenated liquid carbon dioxide may be re-used in the pressure chamber 350. While the embodiments illustrated in FIG. 3 show a liquid carbon dioxide collection system 370, it is to be understood that liquid $CO_2$ cleaning apparatus of the present invention need not have a liquid carbon dioxide collection system. Liquid $CO_2$ can be removed from the pressure chamber 350 in various other ways. For example, the liquid $CO_2$ can be removed by venting to atmosphere, by transferring to another pressurized pressure chamber, or by transferring directly to the liquid carbon dioxide rejuvenation system 390.

The pressure chamber 350 is also in fluid communication with a pressurized gas delivery system 380. The pressurized gas delivery system 380 is configured to introduce pressurized gas, such as $CO_2$ gas, non-$CO_2$ gas or a mixture thereof into the pressure chamber 350.

The pressure chamber 350 is further in fluid communication with an adjunct addition system 355. The adjunct addition system 355 is configured to deliver an adjunct to the pressure chamber 350. While the embodiments illustrated in FIG. 3 show an adjunct addition system 355 that is in direct fluid communication with the pressure chamber 350, it is to be understood that adjunct addition systems according to the present invention may be in fluid communication with the liquid carbon dioxide delivery system 360.

Figure 4:
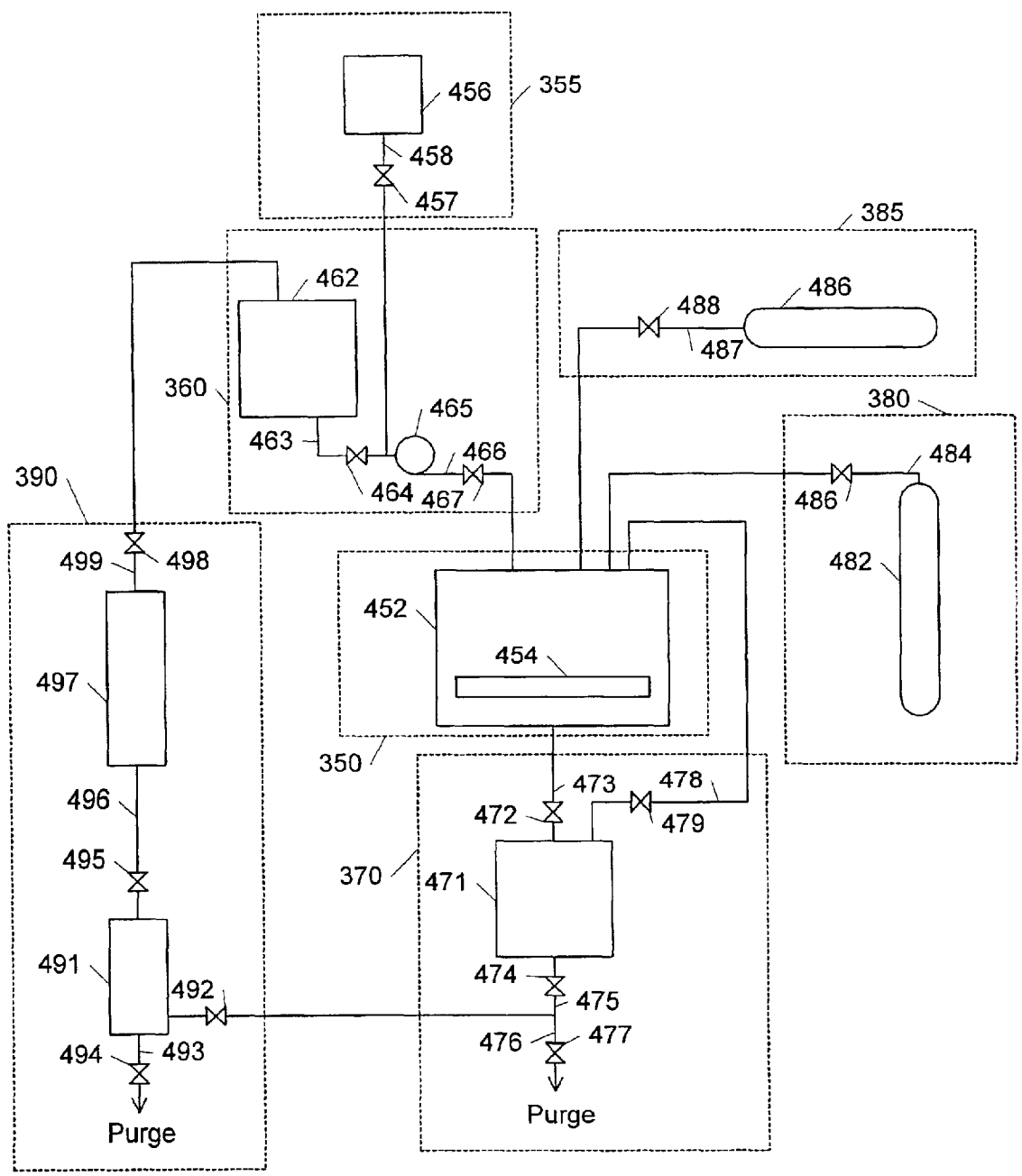
FIG. 4 illustrates an embodiment of a cleaning apparatus according to the present invention.

Referring now to FIG. 4, embodiments of the liquid $CO_2$ cleaning apparatus described in general with respect to FIG. 3 will now be described in more particularity. A pressure chamber 452 contains a microelectronic substrate 454. The pressure chamber 452 is in fluid communication with a liquid carbon dioxide supply vessel 462 via lines 463 and 466, valves 464 and 466 and a pump 465. The liquid carbon dioxide supply vessel 462 is capable of storing liquid carbon dioxide as will be understood by one skilled in the art. The pump 465 is capable of pumping liquid carbon dioxide as will be understood by one skilled in the art. An adjunct addition tank 456 is in fluid communication with the line 463 at the inlet to the pump 465 via a line 458 and a valve 457.

The pressure chamber 452 is in fluid communication with a liquid carbon dioxide collection vessel 471 via a line 473 and a valve 472. The line 473 is preferably a drain line. The vapor space of the pressure chamber 452 is in vapor communication with the vapor space of the liquid carbon dioxide collection vessel 471 via a line 478 and a valve 479. The liquid carbon dioxide collection vessel 471 is capable of storing liquid carbon dioxide as will be understood by one skilled in the art. The contents of the liquid carbon dioxide collection vessel 471 can be purged via lines 475 and 476 and valves 474 and 477.

Alternatively, the contents of the liquid carbon dioxide collection vessel 471 can be transferred to a still 491 via line 470 and valve 492. The still 491 is capable of distilling contaminated liquid carbon dioxide to remove the contaminants therefrom and provide pure carbon dioxide vapor. The still 491 is in fluid communication with a condenser 497 via a line 496 and a valve 495. The condenser 497 is capable of condensing the carbon dioxide vapor produced in the still 491 to provide pure liquid carbon dioxide to the liquid carbon dioxide supply vessel 462 via a line 499 and a valve 498.

A pressurized gas supply vessel 482 is in fluid communication with the pressure chamber 452 via a line 484 and a valve 486. The pressurized gas supply vessel 482 is capable of delivering a supply of pressurized $CO_2$ gas, supercritical $CO_2$, a non-$CO_2$ gas, or a mixture thereof as will be understood by those skilled in the art.

A vapor storage vessel 486 is in fluid communication with the vapor space of the pressure chamber 452 via a line 487 and a valve 488. The vapor storage vessel 486 is capable of withstanding system pressure and temperature as will be understood by those skilled in the art. In some embodiments, the vapor storage vessel 486 may be coupled to another pressure chamber. The other pressure chamber may be on the same apparatus as the pressure chamber 452, may be on a separate cluster tool apparatus, or may be on a separate non-cluster tool apparatus.

As will be understood by those skilled in the art, fluid transfer devices such as pumps and compressors may be inserted into one or more of the various lines as needed in order to facilitate fluid transfer. One who is skilled in the art will appreciate that lines may be selected from a group comprising piping, conduit, and other means of fluid communication that can withstand system temperature and pressure. One who is skilled in the art will also understand that a where one line has been shown in the given embodiment, multiple lines may be employed to provide, for example, supply and return piping. Additionally, more valves may reside in the one or more lines as appropriate.

While embodiments of the liquid $CO_2$ cleaning apparatus according to the present invention described in FIGS. 3 and 4 above have been illustrated for use as a liquid $CO_2$ cleaning module in embodiments of a CMP cluster tool described in FIG. 2 above, it is to be understood that liquid $CO_2$ cleaning modules according to the present invention that employ liquid $CO_2$ cleaning systems of the present invention may be used in various cluster tools (e.g., microelectronic substrate fabrication cluster tools) in conjunction with $CO_2$-based and non-$CO_2$-based modules as will be understood by those skilled in the art. For example, liquid $CO_2$ cleaning modules of the present invention may be used in cluster tools in conjunction with various processing modules including, but not limited to, etch modules; deposition modules such as pulsed vapor deposition modules, chemical vapor deposition modules, electroplating modules, dielectric layer deposition modules, and thin-film deposition modules; implantation modules such as ion implantation modules; chemical mechanical planarization modules; and photolithography modules such as photoresist application modules, photoresist exposure modules and photoresist development modules.

Preferably, liquid $CO_2$ cleaning modules of the present invention may be used to replace various conventional dry and/or wet cleaning modules that are currently used, for example, in conventional cluster tools for microelectronic substrate fabrication. Preferably, liquid $CO_2$ cleaning modules may replace conventional dry and/or wet cleaning modules that are used to remove various waste residues generated during microelectronic substrate fabrication including, but not limited to, chemical mechanical polishing residues, post-ion implantation residues, reactive ion etch residues, post-ash residues, and photoresists.

An example of a microelectronic substrate fabrication method that utilizes a liquid $CO_2$ cleaning module of the present invention will now be described. A substrate having a photoresist pattern thereon is placed into a first module such as a plasma etch chamber of a cluster tool and dual damascene structures such as vias or trenches are etched into low-k material. Next, the post-plasma etch substrate is placed in a second module, which is a plasma strip chamber used to remove photoresist from the substrate. The post-plasma strip substrate is then placed in a liquid $CO_2$ cleaning module of the present invention such as those described above. The liquid $CO_2$ cleaning module of the present invention is used to remove the reactive ion etch and remaining photoresist from the substrate. The liquid $CO_2$ cleaning module also preferably removes impurities and particles from surfaces of the substrate pre-metallization, which may, for example, improve contact resistance of an interconnect system. The liquid $CO_2$ cleaned substrate is then placed in a fourth module that is a barrier deposition module. After barrier deposition, the substrate is moved to a CVD Cu deposition module where metal is deposited onto the substrate. The post-metallization substrate is placed in a Cu CMP module, in which the Cu is planarized. The post-CMP substrate is then moved to a liquid $CO_2$ cleaning module according to the present invention for post-CMP cleaning to remove CMP residual impurities and particles from the substrate. While this process has been described using two separate liquid $CO_2$ cleaning modules, it is to be understood that this process could be performed using a single liquid $CO_2$ module that may employ different adjuncts to achieve the desired cleaning process.

Another example of a microelectronic substrate fabrication process that utilizes a liquid $CO_2$ cleaning module according to embodiments of the present invention will now be described. A substrate having a photoresist pattern thereon is placed into a first module that is a reactive ion etch (RIE) module. The post-RIE substrate is placed in an ion implantation module. The post-ion implantation substrate is placed in a liquid $CO_2$ cleaning module according to the present invention as described above. The liquid $CO_2$ cleaning module removes the ion implantation residue.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An apparatus for processing a microelectronic substrate comprising:
    a transfer module;
    a first processing module that employs liquid carbon dioxide as a cleaning fluid coupled to the transfer module, the first processing module including a pressure chamber and a liquid carbon dioxide supply system in fluid communication with the pressure chamber, wherein the liquid carbon dioxide supply system is adapted to supply the liquid carbon dioxide to the pressure chamber;
    a second processing module coupled to the transfer module; and
    a transfer mechanism coupled to the transfer module, the transfer mechanism configured to move the substrate between the first processing module and the second processing module wherein the first processing module further comprises a pressurized gas delivery system in fluid communication with the pressure chamber, the pressurized gas delivery system being separate from the liquid carbon dioxide supply system; and the pressurized gas delivery system is configured to deliver a pressurized removal gas to the pressure chamber to force liquid carbon dioxide out from the pressure chamber.

2. The apparatus according to claim 1, wherein the liquid carbon dioxide supply system comprises a liquid carbon dioxide supply vessel in fluid communication with the pressure chamber.

3. The apparatus according to claim 1, wherein the first processing module further comprises a liquid carbon dioxide collection system in fluid communication with the pressure chamber.

4. The apparatus according to claim 3, wherein the liquid carbon dioxide collection system comprises a liquid carbon dioxide storage vessel configured to collect contaminated liquid carbon dioxide from the pressure chamber in fluid communication with the pressure chamber.

5. The apparatus according to claim 4, wherein the liquid carbon dioxide storage vessel comprises a heating element and is capable of distilling pure liquid carbon dioxide from contaminated liquid carbon dioxide solutions.

6. The apparatus according to claim 5, wherein the liquid carbon dioxide collection system further comprises a condenser having a vapor inlet in fluid communication with the liquid carbon dioxide storage vessel and a liquid outlet in fluid communication with the liquid carbon dioxide supply system.

7. The apparatus according to claim 4, wherein the pressure chamber is in vapor communication with the liquid carbon dioxide storage vessel and the pressure chamber is separately in liquid communication with the liquid carbon dioxide storage vessel.

8. The apparatus according to claim 3, wherein the first processing module further comprises a liquid carbon dioxide rejuvenation system in fluid communication with the carbon dioxide collection system and in fluid communication with the carbon dioxide supply system.

9. The apparatus according to claim 8, wherein the liquid carbon dioxide rejuvenation system comprises:
    a still in fluid communication with the liquid carbon dioxide storage vessel; and
    a condenser having a vapor inlet in fluid communication with the still and having a liquid outlet in fluid communication with the liquid carbon dioxide supply system.

10. The apparatus according to claim 1, wherein the first processing module further comprises a vapor storage system in fluid communication with the pressure chamber.

11. The apparatus according to claim 10, wherein the vapor storage system comprises a vapor storage tank in fluid communication with the pressure chamber.

12. The apparatus according to claim 10, wherein the vapor storage system comprises:
    a compressor in fluid communication with the pressure chamber; and
    a vapor storage tank in fluid communication with the compressor.

13. The apparatus according to claim 1, wherein the pressurized gas delivery system is configured to deliver pressurized carbon dioxide gas.

14. The apparatus according to claim 1, wherein the pressurized gas delivery system is configured to deliver supercritical carbon dioxide.

15. The apparatus according to claim 1, wherein the pressurized gas delivery system is configured to deliver pressurized inert gas.

16. The apparatus according to claim 1, wherein the first processing module further comprises an adjunct addition system in fluid communication with the pressure chamber.

17. The apparatus according to claim 16, wherein the adjunct addition system is in fluid communication with the pressure chamber via the liquid carbon dioxide supply system.

18. The apparatus according to claim 16, wherein the adjunct addition system is directly in fluid communication with the pressure chamber.

19. The apparatus according to claim 1, further comprising a third processing module that employs liquid carbon dioxide as a processing fluid coupled to the transfer module, wherein the transfer mechanism coupled to the transfer module is configured to move the substrate between the first processing module, the second processing module and the third processing module.

20. The apparatus according to claim 19, wherein the third processing module comprises a pressure chamber in fluid communication with the pressure chamber of the first processing module.

21. The apparatus according to claim 19, wherein the third processing module comprises a pressure chamber; and wherein the apparatus further comprises a carbon dioxide vapor storage vessel that is in fluid communication with the pressure vessel of the first processing module and is in fluid communication with the pressure vessel of the third processing module.

22. The apparatus according to claim 1, further comprising a loadlock module coupled to the transfer module.

23. The apparatus according to claim 1, further comprising a first loadlock module and a second loadlock module.

24. The apparatus according to claim 1, wherein the second processing module comprises a semiconductor processing module.

25. The apparatus according to claim 24, wherein the semiconductor processing module is selected from the group consisting of an etch module, a pulsed vapor deposition module, a chemical vapor deposition module, an electroplating module, a chemical mechanical planarization module, and a thin-film deposition module.

26. The apparatus according to claim 1, wherein the transfer mechanism comprises a robot.

27. The apparatus according to claim 26, wherein the robot comprises an extendable arm and substrate engagement member.

28. The apparatus according to claim 1, wherein the transfer mechanism has a circular configuration.

29. The apparatus according to claim 1, wherein the transfer mechanism has a track configuration.

30. The apparatus of claim 1, wherein the pressurized gas delivery system is configured to deliver the pressurized removal gas to the pressure chamber such that the liquid carbon dioxide is forced plug flowed out from the pressure chamber by the pressurized removal gas.

31. The apparatus of claim 1, including a liquid carbon dioxide collection system in fluid communication with the pressure chamber, and wherein the pressurized gas delivery system is configured to deliver the pressurized removal gas to the pressure chamber to selectively force liquid carbon dioxide out from the pressure chamber and into the liquid carbon dioxide collection system.

32. The apparatus of claim 1, wherein:
the liquid carbon dioxide supply system includes a liquid carbon dioxide supply vessel and a supply of the liquid carbon dioxide in the liquid carbon dioxide supply vessel; and
the pressurized gas delivery system includes a pressurized gas supply vessel of the removal gas that is separate from the supply of the liquid carbon dioxide.

* * * * *